United States Patent [19]

Gotou

[11] Patent Number: 5,264,721

[45] Date of Patent: Nov. 23, 1993

[54] INSULATED-GATE FET ON AN SOI-STRUCTURE

[75] Inventor: Hiroshi Gotou, Niiza, Japan

[73] Assignee: Fujitsu Limited, Kawasaki, Japan

[21] Appl. No.: 824,913

[22] Filed: Jan. 23, 1992

Related U.S. Application Data

[63] Continuation of Ser. No. 509,149, Apr. 16, 1990, abandoned.

[30] Foreign Application Priority Data

Apr. 29, 1989 [JP]  Japan .................................. 1-111654

[51] Int. Cl.$^5$ .......................................... H01L 29/78
[52] U.S. Cl. ................................... 257/349; 257/347; 257/348; 257/352; 257/353
[58] Field of Search ............... 357/23.1, 23.7, 26; 257/347, 348, 349, 352, 353

[56] References Cited

U.S. PATENT DOCUMENTS

| | | |
|---|---|---|
| 4,106,045 | 8/1978 | Nishi . |
| 4,225,875 | 9/1980 | Ipri ..................................... 357/23.7 |
| 4,232,327 | 11/1980 | Hsu ..................................... 357/23.7 |
| 4,312,680 | 1/1982 | Hsu ..................................... 357/23.7 |
| 4,772,927 | 9/1988 | Saito et al. ......................... 357/23.7 |
| 4,797,724 | 1/1989 | Boler et al. . |
| 4,809,056 | 2/1989 | Shirato et al. ...................... 357/23.7 |
| 4,906,587 | 3/1990 | Blake ................................. 357/23.7 |
| 4,907,053 | 3/1990 | Ohmi ................................. 357/23.1 |
| 5,040,037 | 8/1991 | Yamaguchi et al. ............... 357/23.7 |

FOREIGN PATENT DOCUMENTS

| | | |
|---|---|---|
| 0373893 | 6/1990 | European Pat. Off. . |
| 51-147186 | 12/1976 | Japan ................................ 357/23.7 |
| 52-35982 | 3/1977 | Japan . |
| 52-117582 | 10/1977 | Japan . |
| 52-117583 | 10/1977 | Japan . |
| 52-117584 | 10/1977 | Japan . |
| 55-83264 | 6/1980 | Japan . |
| 56-91473 | 7/1981 | Japan ................................ 357/23.7 |
| 58-164268 | 9/1983 | Japan . |
| 59-182566 | 10/1984 | Japan ................................ 357/23.7 |
| 60-187060 | 9/1985 | Japan . |
| 62-188373 | 8/1987 | Japan . |
| 1-27272 | 1/1988 | Japan ................................ 357/23.1 |
| 63-221679 | 9/1988 | Japan . |
| 63-278273 | 11/1988 | Japan ................................ 357/23.7 |
| 64-27272 | 1/1989 | Japan . |

OTHER PUBLICATIONS

IEEE vol. SC-11 No. 4 Aug. 1976 High vol. SOS . . . performance Ronen et al.
Patent Abstracts of Japan, vol. 10, No. 275 (E-438)(2331).
Sep. 18, 1986 & JP-A-61 97964 (Toshiba Corp) May 16, 1986.
Patent Abstracts of Japan, vol. 10, No. 201 (E-419)(2257), Jul. 15, 1986 & JP-A-61-43475 (Agency of Ind Science & Technol), Mar. 3, 1986.

*Primary Examiner*—Andrew T. James
*Assistant Examiner*—Hung Xuan Dang
*Attorney, Agent, or Firm*—Staas & Halsey

[57] ABSTRACT

An SOI-type insulated-gate FET is formed such that an electrical resistance across a pn-junction of the source region is less than that across a pn-junction of the drain region. This is accomplished by providing the FET with a metal dopant, such as aluminum or tungsten; by excessively doping the source region; by providing an amorphous source region; or by providing a layer formed of a material having a different thermal expansion coefficient from the thermal expansion coefficient of the material forming the source region, upon the source region. In the thus fabricated transistor, there is generated a carrier generation center or a precipitation of the impurities at a pn-junction formed between the source region and the semiconductor substrate. Thus, a current path is formed across the pn-junction of the source region in both the forward and reverse directions of a diode of the pn-junction, so as to substantially eliminate the potential difference between the source region and the semiconductor substrate. Accordingly, a kink phenomenon in the drain voltage-current characteristics is eliminated.

17 Claims, 11 Drawing Sheets

55 CONTACT OF GATE ELECTRODE

32 CONTACT OF SEMICONDUCTOR SUBSTRATE

INSULATED-GATE FET ON AN SOI-STRUCTURE

This application is a continuation of application Ser. No. 07/509,149, filed Apr. 16, 1990, now abandoned.

BACKGROUND OF THE INVENTION

1. Field of the Invention

The present invention relates to an insulated-gate FET (field effect transistor), and more particularly to an insulated-gate FET formed on a semiconductor substrate of an SOI (silicon on insulator) structure.

2. Description of the Related Art

It has been well known that there appears a kink phenomenon in drain voltage-current characteristics of a MOS (metal-oxide semiconductor) FET fabricated on an SOI substrate. The relationship of the drain current versus drain voltage while the gate is kept constant is shown in FIG. 1, where an FET on SOI exhibits an increase in the drain current in comparison with a bulk transistor inherently having no kink. Transistors having the kink phenomenon cause overshoot in the output voltage waveform of a source-follower circuit when a pulse voltage is input to the gate electrode, as shown in FIG. 2.

It has been known that the kink phenomenon does not appear if the semiconductor substrate on the SOI substrate is as thin as approximately 1000 Å. However, the kink phenomenon does appear when the semiconductor substrate is thicker than 3000 Å. For SOI substrate thicknesses between 1000 Å and 3000 Å, the kink phenomenon may occur, depending on the operating voltage and the impurity concentration. With a thicker substrate, the voltage at which the kink phenomenon occurs becomes lower (see FIG. 1). Further, the higher the impurity concentration, the more likely it is that the kink phenomenon will occur.

While the kink phenomenon does not appear when a very thin semiconductor substrate is employed, there is a problem in that the manufacture of a semiconductor substrate as thin as 1000 Å on an SOI substrate is very difficult, and accordingly, the production cost is far beyond that of an approximately 1 μm thick semiconductor substrate on an SOI substrate. Therefore, there has been a need to develop a semiconductor device structure which causes no kink phenomenon, even if the semiconductor substrate is approximately 1 μm thick. It is supposed that the kink phenomenon is caused by a part of the semiconductor substrate beneath the channel and in the vicinity of the insulating substrate, which becomes floating so as to cause fluctuation in the potential during operation.

In order to suppress the potential fluctuation of the semiconductor substrate, a contact electrode is provided on a region of the semiconductor substrate extending from the channel, as disclosed in Japanese Unexamined Patent Publication (Kokai) No. 52-35922 (published Mar. 9, 1977) and as described below.

FIG. 3(a) is a cross-sectional side view of a main portion of a prior art transistor. FIG. 3(b) is a plan view showing the electrode layout. In FIGS. 3(a) and 3(b), the numeral 1 denotes a supporting substrate; the numeral 2 denotes an insulating layer; the numeral 21 denotes an insulating film; the numeral 3 denotes a semiconductor substrate; the numeral 31 denotes a channel; the numeral 32 denotes a substrate contact; the numeral 4 denotes an element isolation region; the numeral 5 denotes a gate; the numeral 51 denotes a gate insulating oxide film; the numeral 52 denotes an oxide film; the numeral 55 denotes a gate electrode contact; the numeral 6 denotes a source region; the numeral 61 denotes a source contact; the numeral 7 denotes a drain region; and the numeral 71 denotes a drain contact. An SOI substrate is composed of supporting substrate 1, insulating layer 2 and semiconductor substrate 3. As seen in FIG. 3(b), a part of the semiconductor substrate 3 extending from channel 31 which is located beneath gate electrode 5, is provided with a substrate contact 32. Substrate contact 32 is connected to source contact 61 via external wiring, and is typically grounded. This configuration has a disadvantage in that the long distance d (illustrated in FIG. 3(b)) between channel 31 and substrate contact 32 causes an increase in electrical resistance. This is likely to cause fluctuation in the channel potential, and accordingly, the kink phenomenon cannot be completely suppressed. Furthermore, there is a disadvantage in that the provision of the substrate contact 32 requires an additional mask process, as well as an increase in the area occupied by each transistor.

SUMMARY OF THE INVENTION

It is a general object of the invention, therefore to provide an SOI-type insulated-gate FET having reduced kink phenomenon in its drain current characteristics.

It is another object of the invention to provide an SOI-type insulated-gate FET which can be integrated at a high density.

An SOI-type insulated-gate FET according to the present invention is formed such that an electrical resistance across a pn-junction of the source region is less than the electrical resistance across a pn-junction of the drain region. This is accomplished by providing the FET with a metal dopant, such as aluminum or tungsten; by excessively doping the source region; by providing an amorphous source region; or by providing a layer formed of a material having a thermal expansion coefficient which is different from the thermal expansion coefficient of the material forming the source region, upon the source region. The reduced electrical resistance provides a current path across the pn-junction of the source region, which substantially eliminates the potential difference between the source region and the semiconductor substrate.

The above-mentioned features and advantages of the present invention, together with other objects and advantages, which will become apparent, will be more fully described hereinafter, with reference being made to the accompanying drawings which form a part hereof, wherein like numerals refer to like parts throughout.

DESCRIPTION OF THE PREFERRED EMBODIMENTS

Figure 4A:
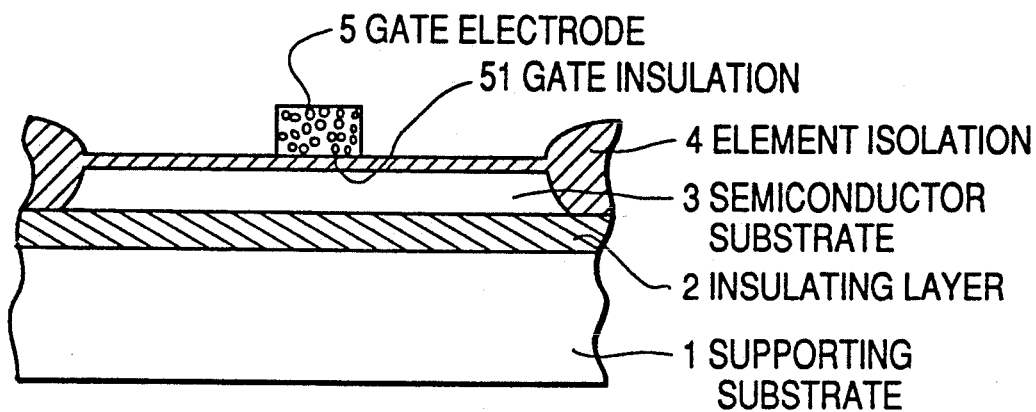
FIGS. 4(a), 4(b), 4(c), 4(d) and 4(e) are cross-sectional side views of a semiconductor device at different stages during fabrication, in accordance with a first preferred embodiment of the present invention.

In fabricating an SOI-type insulated-gate transistor in accordance with a first preferred embodiment of the present invention, a typically 1 μm thick insulating layer 2 formed of $SiO_2$ (silicon dioxide) and a typically 1 μm thick semiconductor substrate 3 of p-type silicon thereon are formed upon a typically 500 μm thick supporting substrate formed of silicon, according to a wafer bonding and thinning method or SIMOX (separation by implanted oxygen) technique so as to form an SOI substrate, as shown in FIG. 4(a). A typically 1 μm thick element-isolation 4 for isolating, for example, adjacent transistors, a typically 300 Å thick gate insulation 51 and a gate electrode 5 of polycrystalline silicon are formed on the SOI substrate according to well-known techniques.

Figure 4B:
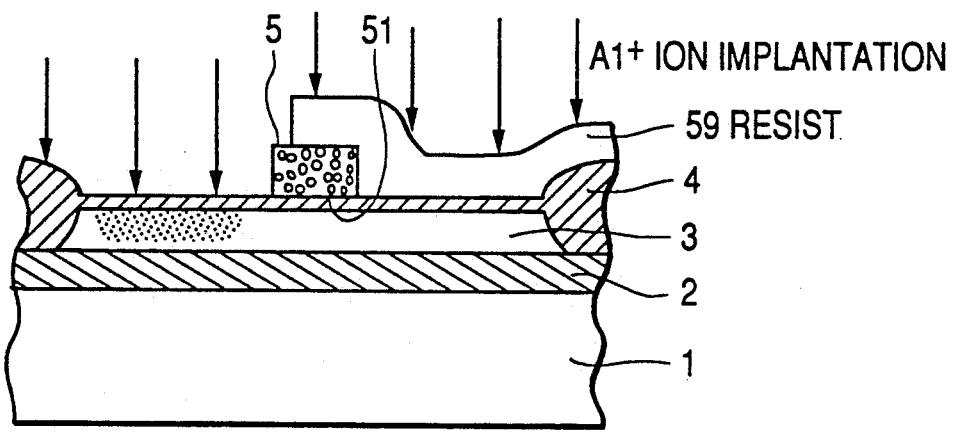

Next, as shown in FIG. 4(b), a metal ion, for example, an aluminum ion (Al+) is implanted into a part of the semiconductor substrate 3 which is to be a source region. The implant conditions are typically an implantation energy of 50 keV and a dosage of $1 \times 10^{15}$ cm$^{-2}$, and the remaining portion is masked with a resist 59.

Figure 4C:
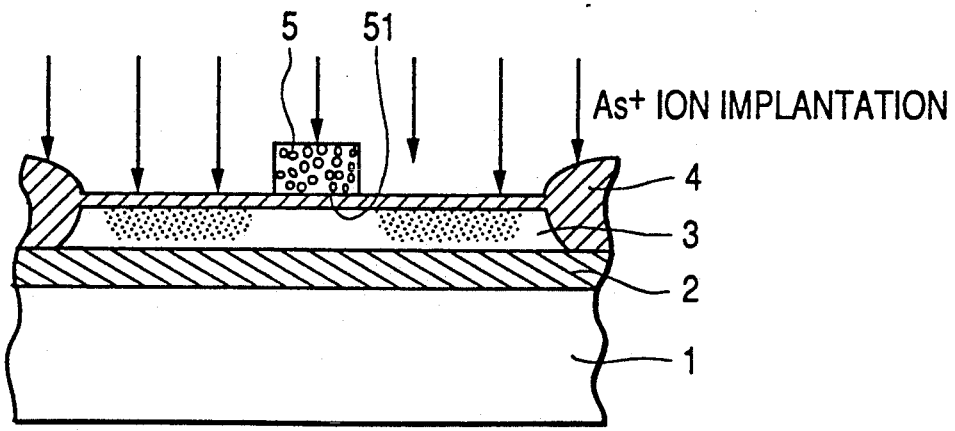

Next, as shown in FIG. 4(c), after removing the resist 59, arsenic ions (As+) as an n-type dopant are implanted into the entire surface. The implant conditions are typically 100 keV and $5 \times 10^{15}$ cm$^{-2}$ in dose.

Figure 4D:
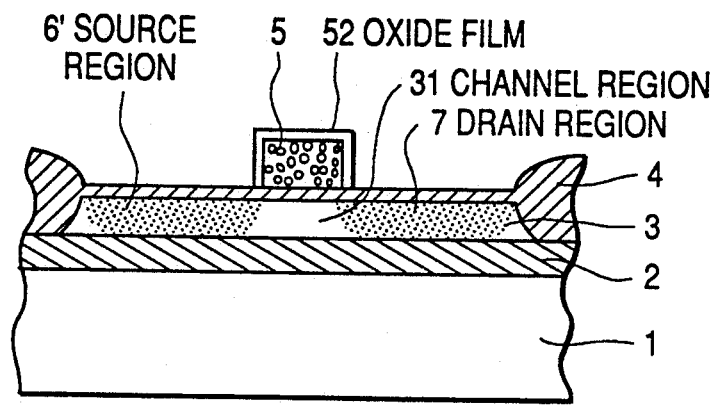

Next, as shown in FIG. 4(d), exposed surfaces of the polycrystalline silicon gate electrode 5 are oxidized according to a well-known heat process so as to form a 500 Å insulating oxide film 52. During the heating process for oxidation, the ion-implanted impurities are diffused so that the arsenic impurity forms a source region 6' and a drain region 7. THe aluminum impurity reaches a pn-junction formed between source region 6' and semiconductor substrate 3, while the portion of the semiconductor substrate 3 beneath the gate electrode 5 becomes a channel 31. The impurity concentrations are approximately $1.5 \times 10^{20}$ cm$^{-3}$ of arsenic in the drain and source regions and $3 \times 10^{19}$ cm$^{-3}$ of aluminum additionally in the source region 6'.

Figure 1:
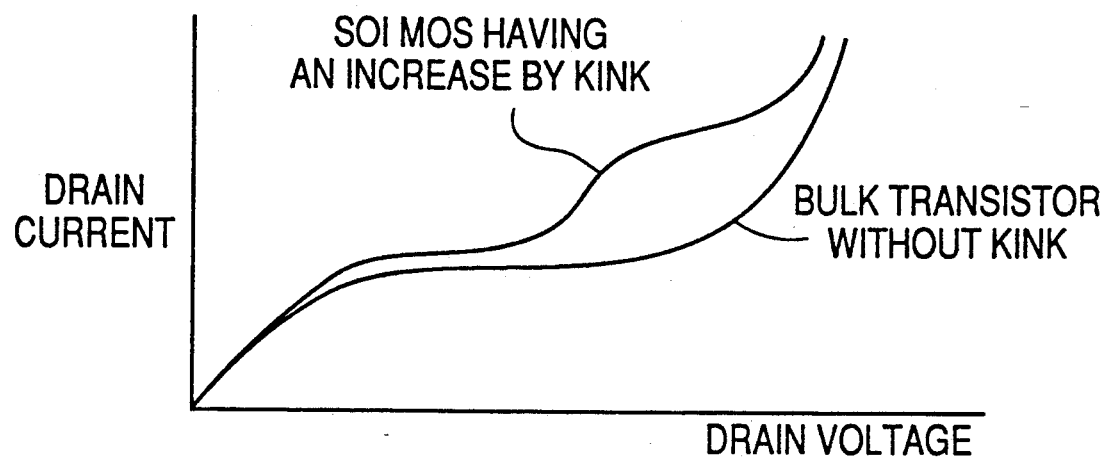
FIG. 1 is a plot of drain voltage versus drain current characteristics of transistors with and without a kink phenomenon.
Figure 2:
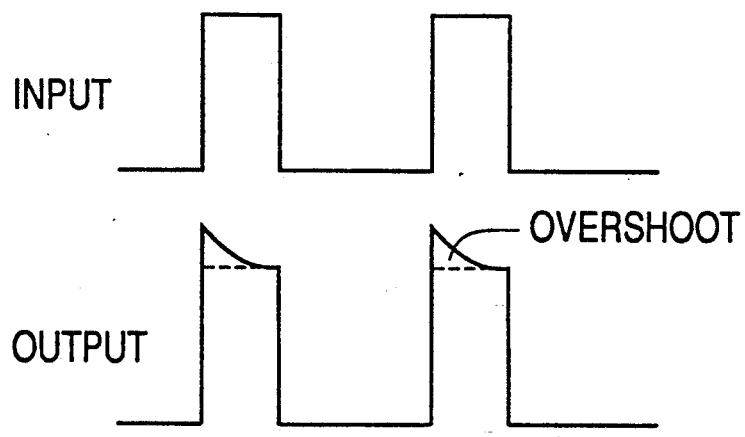
FIG. 2 is a waveform diagram of output pulse waveforms of a source-follower circuit, having overshoot caused from the kink phenomenon.
Figure 3A:
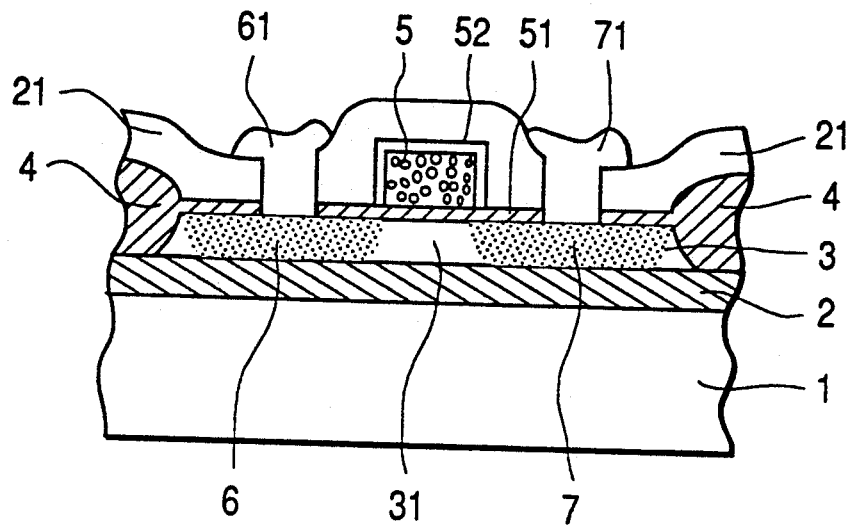
FIG. 3(a) is a cross-sectional side view of a prior art SOI-type MOS transistor.
Figure 3B:
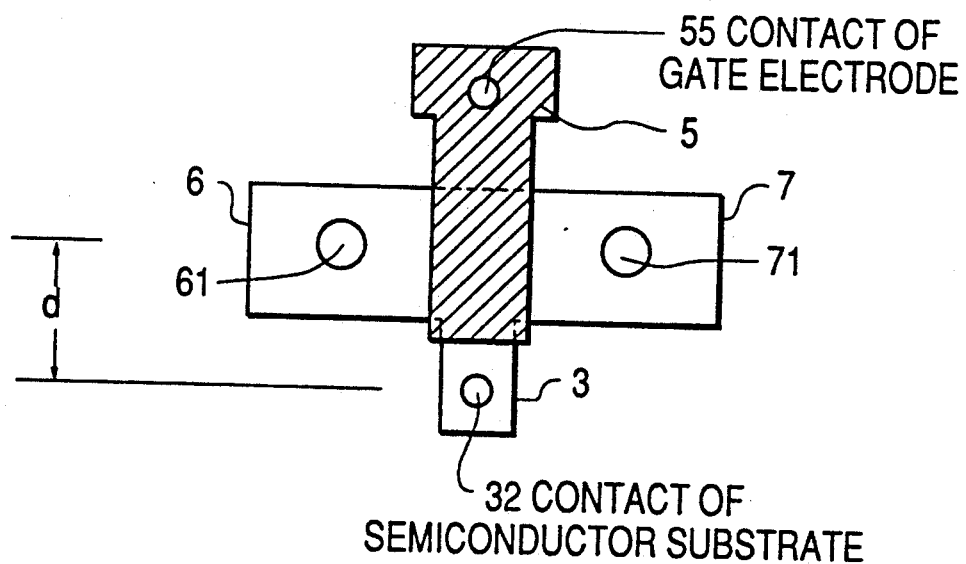
FIG. 3(b) is a plan view of the FIG. 3(a) prior art transistor.
Figure 4E:
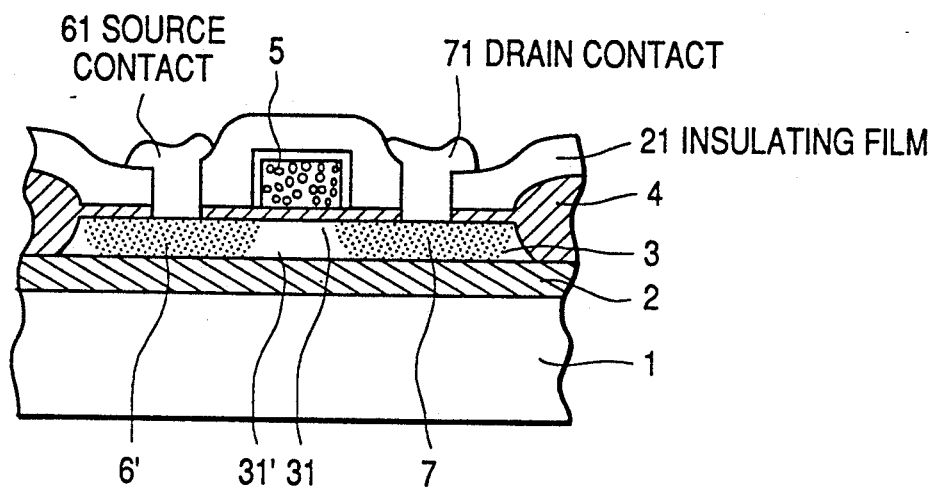
Figure 5:
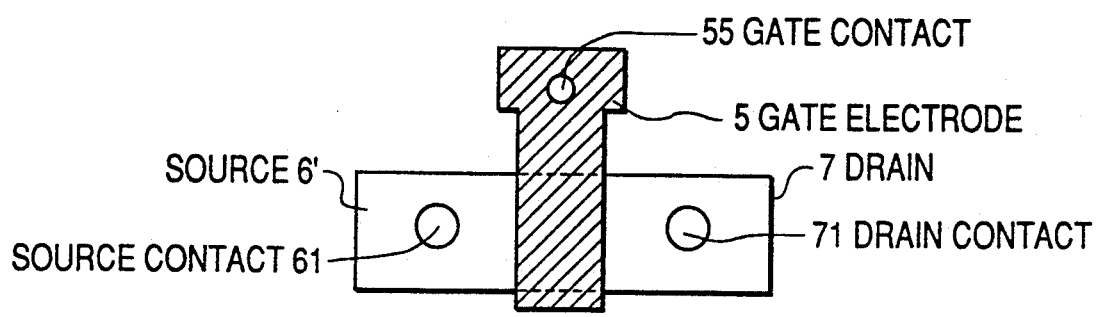
FIG. 5 is a plan view of the FIG. 4(e) transistor.

Next, as shown in FIG. 4(e), an insulating film 21 formed of PSG (phosphosilicate glass) is deposited typically as thick as 1 μm upon the entire surface of the thus fabricated substrate, according to a well-known technique. Insulating film 21 is provided with contact holes so as to expose source region 6', drain region 7 and gate electrode 5 according to a well-known photolithography technique. Afterward, aluminum is sputtered upon the entire surface according to a well-known technique, and the aluminum film is patterned so as to form a source contact 61, a drain contact 71 and a gate contact 55. FIG. 5 is a plan view of these contacts, which illustrates that the prior art contact 32 (FIG. 3(b)) of the semiconductor substrate is no longer provided in the present invention.

The boundary between channel 31 and source region 6' which is doped with the arsenic, forms a pn-junction. The metal impurity, i.e., aluminum, diffused into the source region 6' further reaches the pn-junction, where the aluminum atom functions as a carrier generation center, in other words, as a leakage current path across the pn-junction. Thus, the currents of the diode of the pn-junction increase in both the forward and reverse directions. This increased leakage current, particularly in the forward direction, contributes to essentially eliminating the potential difference between source region 6' and the portion of semiconductor substrate 31' located beneath the channel 31. In other words, the portion of the semiconductor substrate 31' beneath the channel 31 is prevented from floating. Therefore, the kink phenomenon can be suppressed.

Figure 6:
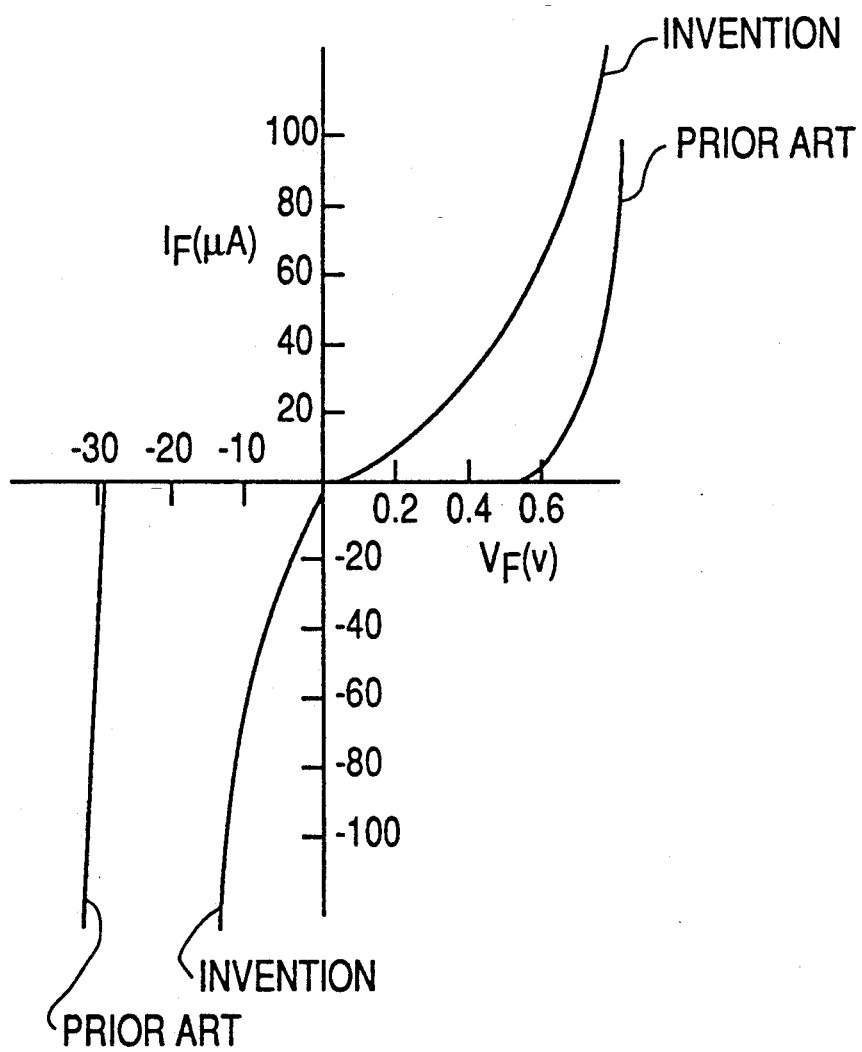
FIG. 6 is a graph of drain voltage versus drain current characteristics of the FIG. 4(e) transistor.

FIG. 6 is a graph of the diode characteristics of the pn-junction of the source region 6' in comparison to that of a prior art SOI MOS transistor, where $V_F$ denotes the forward voltage in volts and $I_F$ denotes a forward current in microamperes of the diode of the pn-junction. The diode characteristics are measured with an experimentally provided contact electrode (not shown in the figure) which is lead out from the semiconductor substrate. It is also observed, in drain voltage versus drain current characteristics (not shown) that an SOI MOS transistor in which aluminum ions have been implanted according to the present invention, has a 20% reduction in the increase in the drain current caused from the kink phenomenon. Accordingly there is a 15% reduction in overshoot in its pulse operation.

Figure 7A:
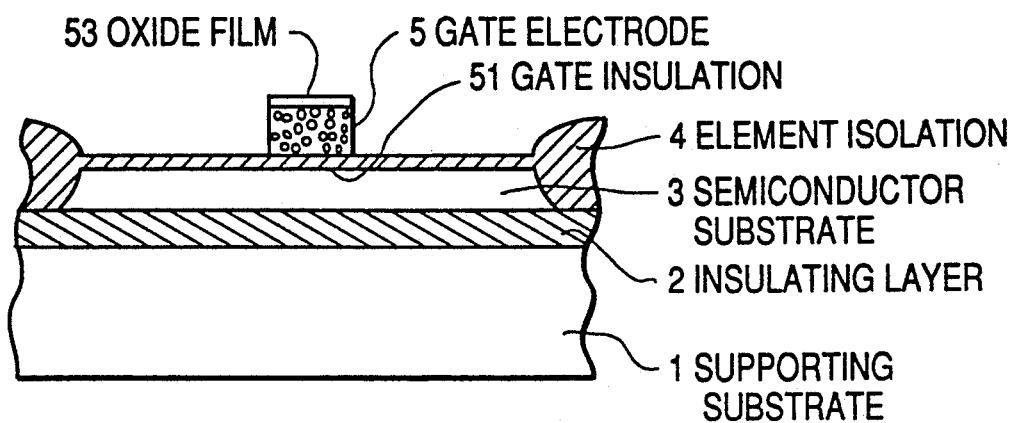
FIGS. 7(a), 7(b), 7(c), 7(d), 7(e) and 7(f) are cross-sectional side views of a semiconductor device at different stages during fabrication, in accordance with a second preferred embodiment of the present invention.

FIGS. 7(a), 7(b), 7(c), 7(d), 7(e) and 7(f) are cross-sectional side views of the fabrication steps of a second preferred embodiment of the present invention. The SOI substrate composed of supporting substrate 1 of silicon, insulating layer 2, and semiconductor substrate 3 of p-silicon are essentially the same as those of the first preferred embodiment shown in FIG. 4(e). Moreover, as shown in FIG. 7(a), the steps of fabricating element isolation 4, gate insulation 51, gate electrode 5 formed of polycrystalline silicon and oxide film 53, are fabricated upon the SOI substrate according to well-known techniques.

Figure 7B:
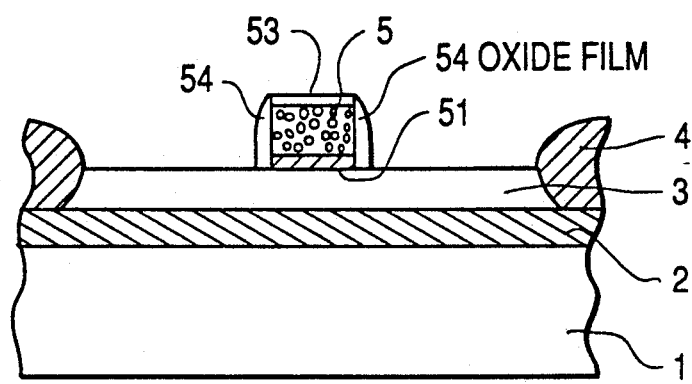
Figure 7C:
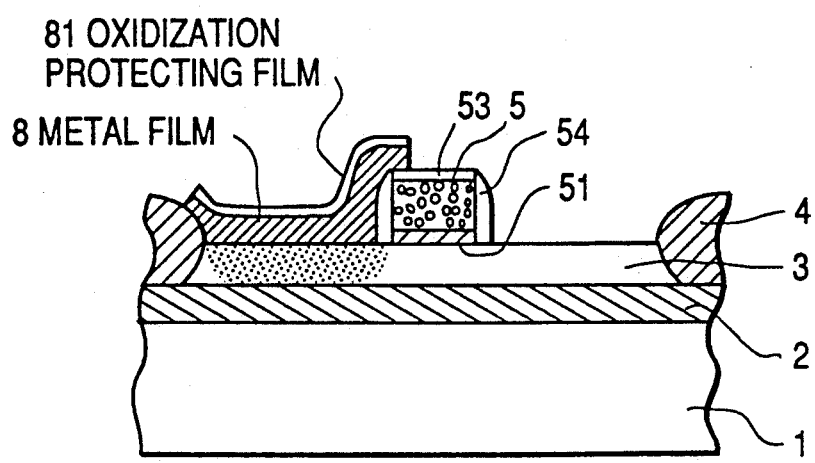

Next, as shown in FIG. 7(b), an oxide film 54 is formed on side walls of gate electrode 5 according to a well-known technique. Next, according to a CVD method, a tungsten (W) film 8 is deposited as thick as, for example 3000 Å, on the FIG. 7(b) substrate, and $Si_3N_4$ (silicon nitride) film 81 is deposited entirely thereon as an oxidization protection film as thick as, for example 500 Å. Tungsten film 8 and $Si_3N_4$ film 81 are then patterned with a well-known photolithography technique so as to be left only upon an area which is to be the source region, as shown in FIG. 7(c). The patterned substrate is then heated in nitrogen gas up to typically 1100° C. for 30 minutes. This heat process causes the tungsten 8 deposited on the surface to diffuse into the part of the semiconductor substrate which is to be a source region.

Figure 7D:
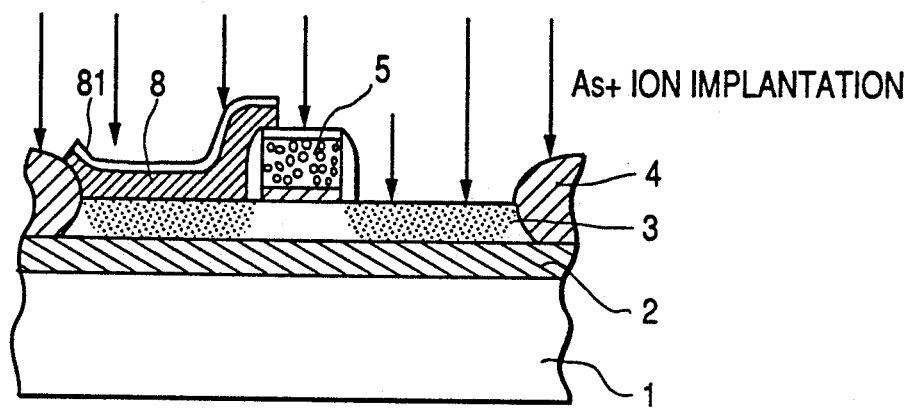
Figure 7E:
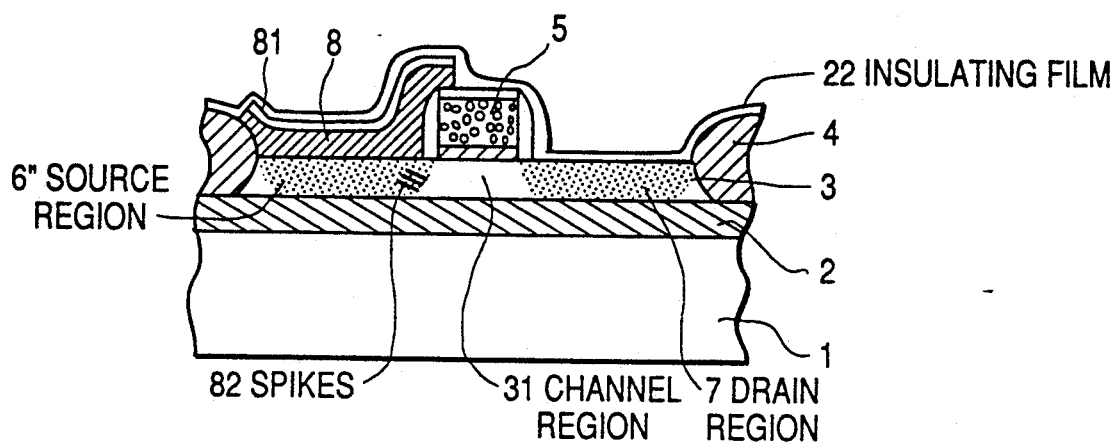

Next, as shown in FIG. 7(d), arsenic ions (As+) are implanted onto the entire surface of the FIG. 7(c) substrate at typically 100 keV and $5 \times 10^{15}$ cm$^{-2}$ in dose. Next, a typically 1000 Å thick SiO$_2$ insulating film 22 is deposited on the FIG. 7(d) substrate according to a CVD method, as shown in FIG. 7(e), and the substrate is heated in a nitrogen gas at typically 1000° C. for 20 minutes. This heat process causes the arsenic impurity to diffuse to form a source region 6'' as well as a drain region 7. The semiconductor impurity concentration is now $1.5 \times 10^{20}$ cm$^{-3}$ of arsenic in the source and drain regions. During this heat process, the tungsten diffuses into the source region 6'' so that the impurities precipitate to generate spikes 82 across the pn-junction between the source region 6'' and channel region 31, because the impurity concentration is larger than the solid solubility of the impurities.

Figure 7F:
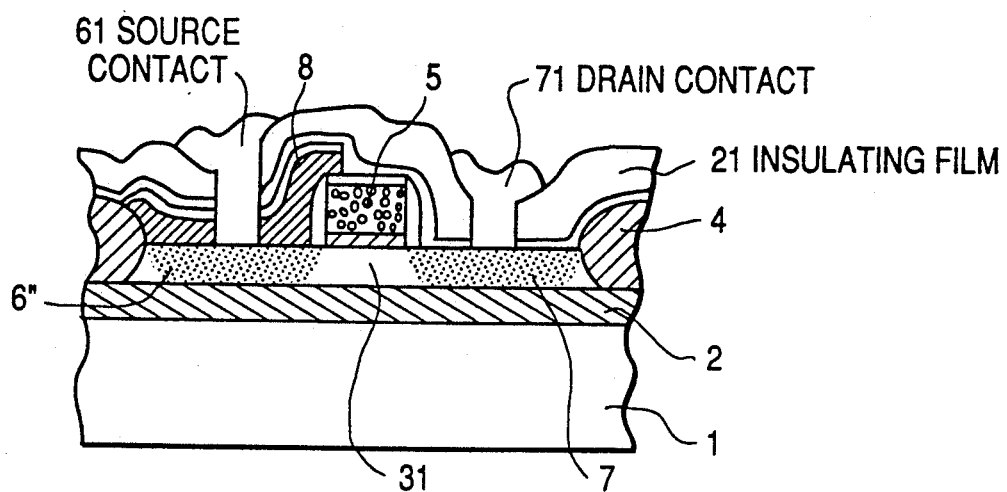

Next, as shown in FIG. 7(f), in the same way as in the first preferred embodiment, an insulating film 21 of PSG is deposited entirely thereon. Contact holes are opened so as to expose source region 6'' and drain region 7, and aluminum is sputtered entirely thereon. The sputtered aluminum is patterned so as to form a source contact electrode 61 and a drain contact electrode 71. The plan layout of the source 6'', the drain 7 and the gate electrode 5 is identical to that of the first preferred embodiment. In this configuration, the precipitated impurity spikes 82 provide current paths across the pn-junction for both the forward and reverse diode characteristics of the pn-junction, resulting in the same advantageous effect as that of the first preferred embodiment.

Figure 8:
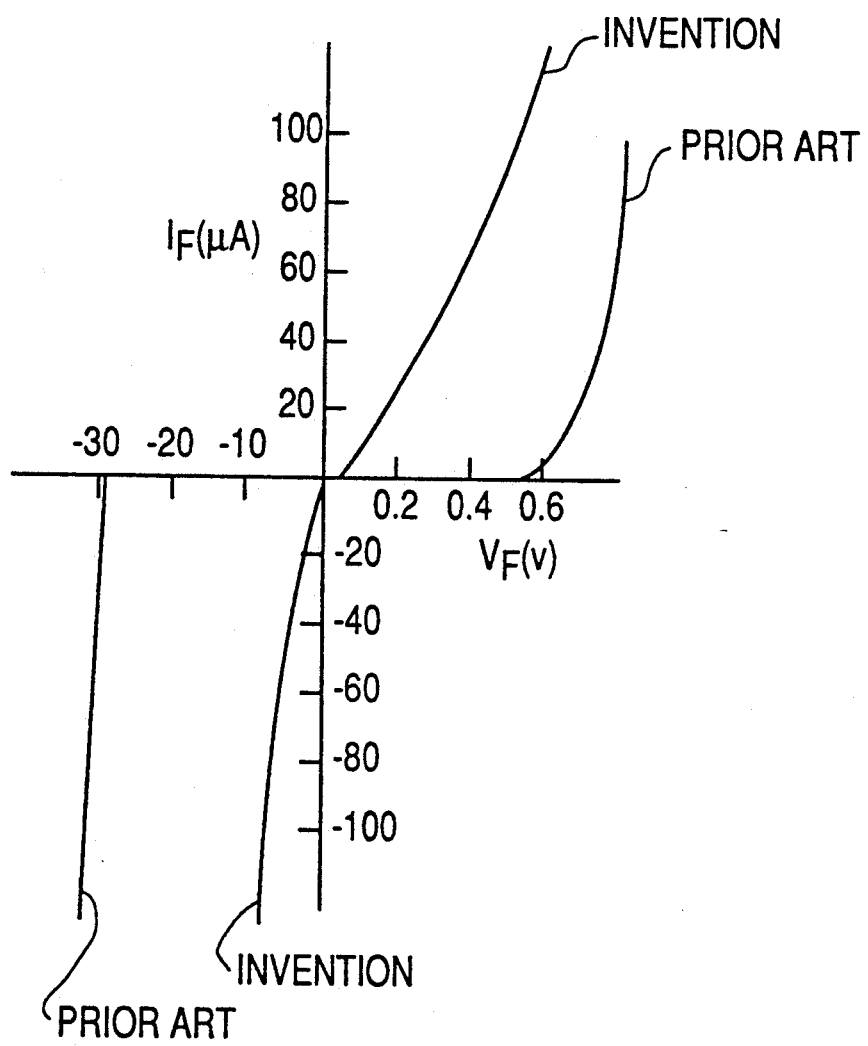
FIG. 8 is a graph of drain voltage versus drain current characteristics of the FIG. 7(f) transistor.

FIG. 8 is a graph of the diode characteristics of the pn-junction of the source region of an SOI MOS transistor according to the second preferred embodiment of the present invention in comparison to that of a prior art SOI MOS transistor. The diode characteristics are measured in the same way as the FIG. 6 characteristics. It is also observed in drain voltage versus drain current characteristics (not shown) that an SOI MOS transistor according to the second embodiment causes a 20% reduction in the increase in the drain current caused from the kink phenomenon, and accordingly a 15% reduction in overshoot in a pulse operation.

A third preferred embodiment of the present invention is hereinafter described (no drawing is shown therefor). The third preferred embodiment is such that the aluminum ion implantation into the source region as shown in FIG. 4(b) is replaced with As+ ion implantation of more than 10 times the implantation dose for the drain region, that is, approximately $10^{17}$ cm$^{-2}$ in dose. Next, the doped substrate is heated in a nitrogen gas at, for example approximately 950° C., for 30 minutes. Due to the excess dopant which provides much more than normal impurity concentration, the normal pn-junction, i.e., normal diode, is not formed and a carrier generation center is provided at the pn-junction so as to cause a leakage current in both the forward and reverse characteristics of the pn-junction diode. The leakage currents contribute to eliminate the potential difference between the source region 6' and semiconductor substrate portion 31' which is beneath the channel region 31, resulting in the same advantageous effect as the first and second preferred embodiments.

A fourth preferred embodiment of the present invention is hereinafter described (no drawing is shown therefor). In place of the aluminum ion implantation for the above-described first preferred embodiment of the present invention, an oxygen ion or a carbon ion may be implanted into the source region. The oxygen atom, or the carbon atom, combined with silicon atoms in the source region generates crystal defects therein. The generated crystal defects provide a carrier generation center at the pn-junction of the source region, so as to provide a leakage path across the pn-junction for some degree. However, the effect is not as great as that produced by the metal impurities of the first and second preferred embodiments.

Though in the above-described first, second and fourth preferred embodiments the additional impurity doped into the source region is single, such as only aluminum, tungsten or carbon, a plurality of these impurities may be doped into the source region, such as aluminum+tungsten, tungsten+carbon, tungsten+titanium, tungsten+oxygen and so on. The advantage of the plural additional dopants is an effective increase in the leakage current.

A fifth preferred embodiment of the present invention is hereinafter described (no drawing is shown therefor). Before the resist formation and the aluminum ion implantation into the source region shown in FIG. 4(b), the substrate is implanted with the arsenic ion equally into both the region which is to be the source region and the region which is to be the drain region under the same conditions as described with respect to FIG. 4(c). Next while the drain region is masked as in FIG. 4(b), argon ions are implanted only into the source region at typically 100 keV and $10^{16}$ cm$^{-2}$ in dose, so as to make the silicon of the source region amorphous. The argon ion does not chemically react with the implanted silicon and the formed amorphous silicon in the source region causes crystal defects therein. Accordingly, a carrier generation center is formed at the pn-junction so as to provide a current leakage path across the pn-junction diode. This contributes to eliminating a potential difference between the source region 6' and the portion of semiconductor substrate 31' beneath the channel region 31, resulting in the same advantageous effect of the above-described preferred embodiments.

Figure 9A:
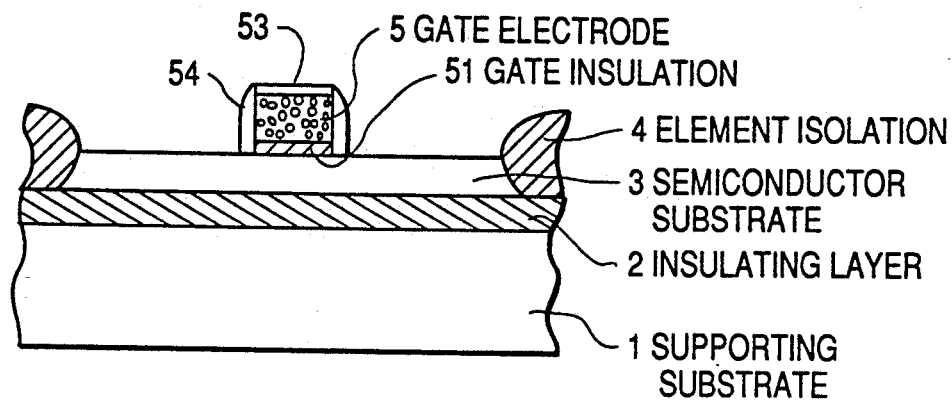
FIGS. 9(a), 9(b), 9(c) and 9(d) are cross-sectional side views of a semiconductor device at different stages during fabrication, in accordance with a sixth preferred embodiment of the present invention.

FIGS. 9(a), 9(b), 9(c) and 9(d) are cross-sectional side views of the fabrication steps of a sixth preferred embodiment of the present invention. As shown in FIG. 9(a), upon an SOI substrate composed of supporting substrate 1 of silicon, there are formed insulating layer 2 of SiO$_2$, semiconductor substrate 3, element isolation region 4, gate insulation 51, and gate electrode 5 formed of polycrystalline silicon and oxide films 53 and 54, in essentially the same manner as shown in FIGS. 7(a) and 7(b) for the second preferred embodiment.

Figure 9B:
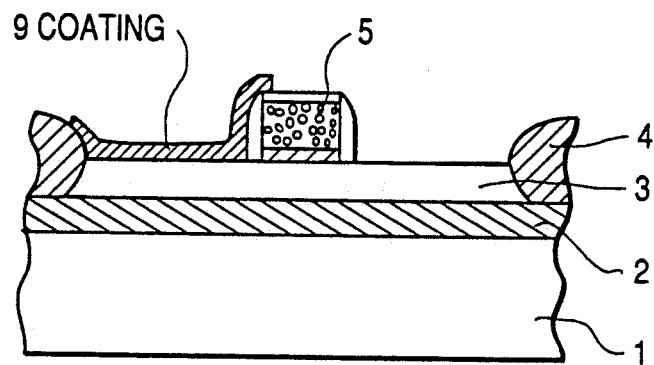
Figure 9C:
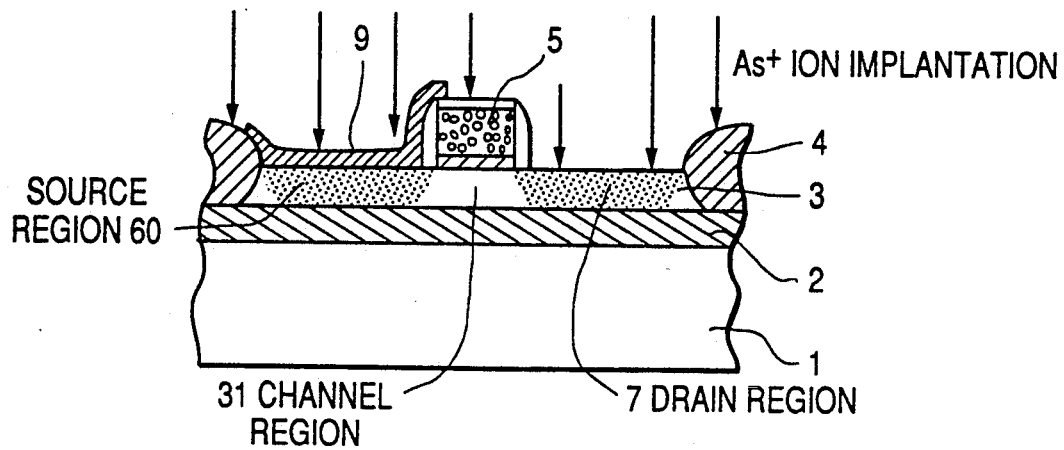
Figure 9D:
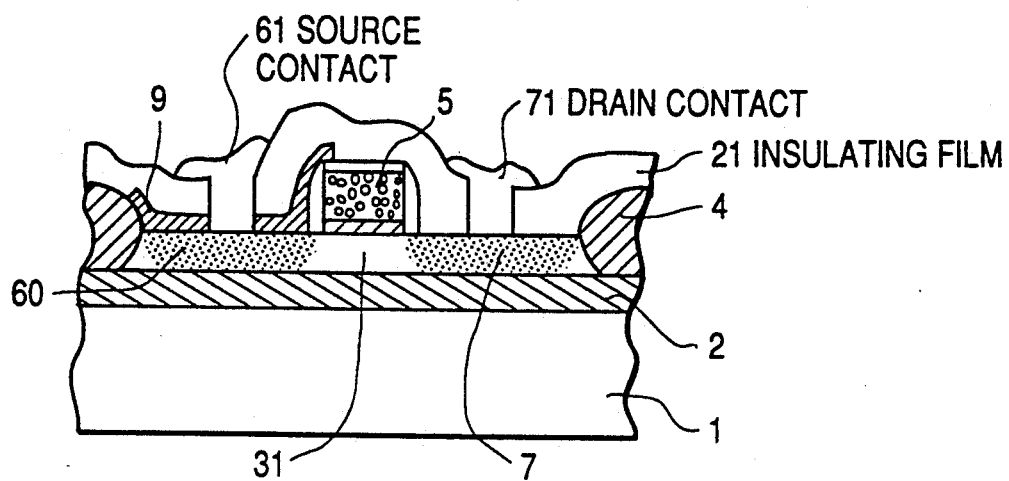

Next, according to a well-known CVD method and a photolithography technique, a typically 3000 Å Si$_3$N$_4$ coating 9 is formed upon a portion of the semiconductor substrate which is to be a source region as shown in FIG. 9(b). Next, arsenic ions (As+) are implanted into the entire surface of the thus prepared substrate at conditions of typically 100 keV and $5 \times 10^{15}$ cm$^{-2}$ in dose as shown in FIG. 9(c). The ion-implanted substrate is heated at typically 950° C., for 30 minutes, so that the implanted arsenic diffuses to form a source region 60 and a drain region 7. Next, as shown in FIG. 9(d), a PSG film 21 is coated over the entire surface as an insulating film and contact holes are opened so as to expose the source and drain regions. Aluminum is sputtered thereon and patterned so as to form a source contact 61 and a drain contact 71 in essentially the same way as in the first preferred embodiment. The thermal expansion coefficients of the materials forming source region 60, drain region 7, coating 9 and insulating film 21 are as follows:

| Item | Material | Thermal Expansion Coefficient |
|---|---|---|
| source region 60 | p-Si | $2.6 \times 10^{-6}/°C$ |
| drain region 7 | p-Si | $2.6 \times 10^{-6}/°C$ |
| coating 9 | $Si_3N_4$ | $4 \times 10^{-6}/°C$ |
| insulating film 21 | PSG | $3 \times 10^{-6}/°C$ |

As seen from the above table, the difference in the thermal expansion coefficients of source region 60 and coating 9 therein is larger than the difference in the thermal expansion coefficients of drain region 7 and insulating film 21 coated thereon. Therefore, more internal stress is generated in source region 60 than in drain region 7. This internal stress causes a piezo-resistive effect. The piezo-resistive effect produced by the internal stress alters the forbidden bandwidth at the pn-junction, resulting in a change in the intrinsic carrier density. Accordingly the pn-junction diode characteristics are altered so as to increase a leakage current in both directions across the pn-junction.

Figure 10:
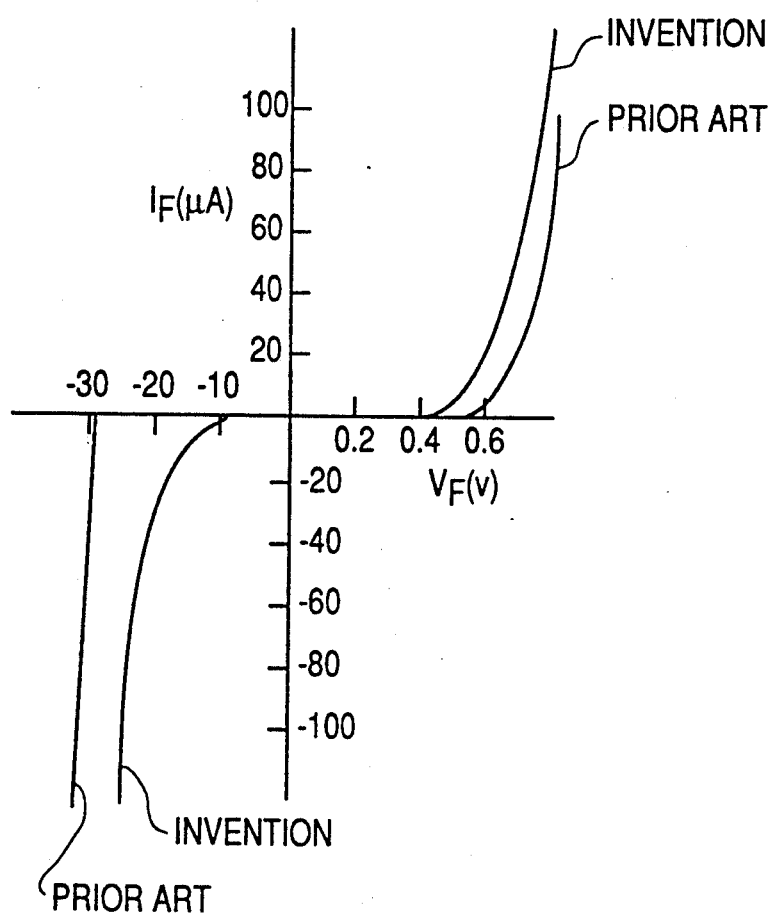
FIG. 10 is a graph of drain voltage versus drain current characteristics of the FIG. 9(d) transistor.

FIG. 10 is a graph of the diode characteristics of the pn-junction of the source region of an SOI MOS transistor according to the sixth preferred embodiment of the present invention in comparison to that of a prior art SOI MOS transistor. The diode characteristics are measured in the same way as the characteristics illustrated in FIG. 6. It is also observed in drain voltage versus drain current characteristics (not shown) that an SOI MOS transistor to which thermal stress is imposed according to this embodiment of the present invention has a 15% reduction in the increase in the drain current caused from the kink phenomenon, and accordingly a 10% reduction in the overshoot in its pulse operation.

Figure 11:
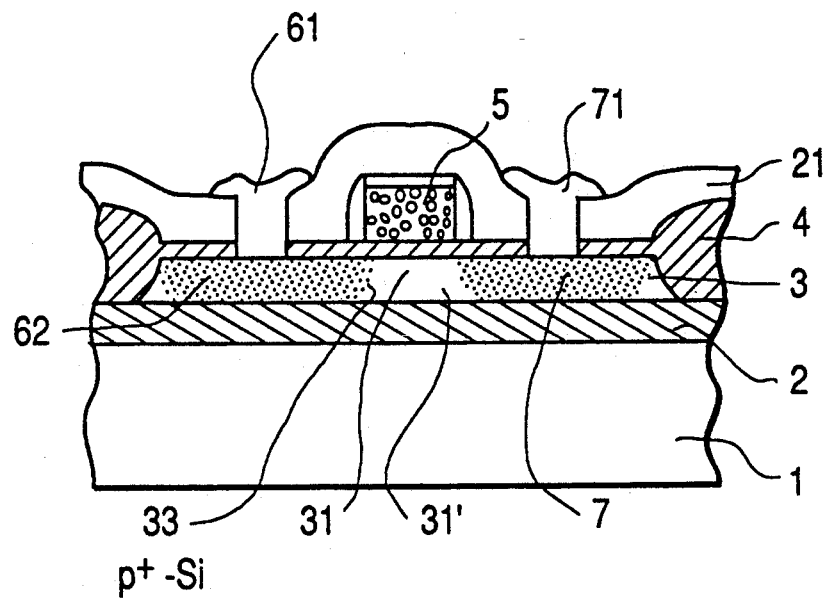
FIG. 11 is a cross-sectional side view of a semiconductor device in accordance with a seventh preferred embodiment of the present invention.

FIG. 11 is a cross-sectional side view of a seventh preferred embodiment of the present invention. Element isolation 4, gate insulation 51, and gate electrode 5 formed of polycrystalline silicon are fabricated on an SOI substrate composed of supporting substrate 1 of silicon, insulating layer 2 and semiconductor substrate 3 of p-silicon, essentially in the same way as in the first preferred embodiment shown in FIG. 4(a). Next, after a resist is patterned over the portion other than the portion which is to be a source region, boron ions are implanted into the portion which is to be a source region under conditions of typically 50 keV and $1 \times 10^{15} cm^{-2}$ in dose, instead of the aluminum ion implantation shown in FIG. 4(b).

Next, in essentially the same way as the first preferred embodiment, after removing the resist, arsenic ions ($As^+$) as n-type dopant, are implanted into the entire surface under conditions of typically 100 keV and $5 \times 10^{15} cm^{-2}$ in dose. Exposed surfaces of the polycrystalline silicon gate electrode 5 are oxidized according to a well-known heat process so as to form insulating oxide films. By this heat process, the ion-implanted boron and arsenic are diffused, so that the boron forms a higher-doped $p^+$ region 33 in the p-Si substrate 3, and the arsenic forms a source region 62 and a drain region 7. The impurity concentrations are typically $1.5 \times 10^{20}$ $cm^{-3}$ of arsenic in the drain region 7 and source region 62, and at least $1 \times 10^{18}$ (typically, $2 \times 10^{19}$) $cm^{-3}$ of boron in the higher doped region 33, while the p-Si substrate has a concentration of $10^{16}$ $cm^{-3}$. Thus, a tunnel diode is formed at the pn-junction. Furthermore, in the same way as in the first preferred embodiment, a PSG insulating film 21, source contact 61, drain contact 71 and gate electrode 55 are formed, according to well-known techniques. In this transistor, a tunnel current is generated through the pn-junction of the source region 62. The tunnel current functions so as to reduce the potential difference between the source region 62 and the region 31' beneath the channel region 31 in semiconductor substrate 3, resulting in an advantage in that the kink effect is reduced as in the above preferred embodiments. In order to realize the concept of the seventh preferred embodiment, the structure of the tunnel diode is not limited to that disclosed above, as long as a tunnel diode is formed at the pn-junction of the source region.

Though in the above-described preferred embodiments aluminum and tungsten are disclosed as metal impurities which cause the leakage across the pn-junction, other metals, such as molybdenum, platinum, titanium and tin, and combinations of these metals can be employed in place of aluminum or tungsten in the first, second, fourth and fifth preferred embodiments.

Though in the above-described embodiments the semiconductor substrate 3 is disclosed to be formed by p-type silicon, it is apparent that the concept of the present invention may be embodied in an SOI type insulated-gate transistor fabricated on an n-type silicon substrate. In that case, the dopant which forms the source and drain regions may be boron. The metal impurity which causes the leakage current across the pn-junction may be the same as that used for the p-silicon substrate. The dopant which forms the higher doped region (in this case an $n^-$-Si region) in the semiconductor substrate 3 as a variation of the seventh preferred embodiment may be arsenic or phosphorus. The conditions of ion implantation, as well as heat process, may also be the same.

Though in the above-described preferred embodiments a silicon plate and silicon dioxide formed thereon are referred to as the insulating substrate of the SOI structure, it is apparent that the concept of the present invention may be embodied in an insulated-gate transistor formed on other kinds of SOI substrates.

The many features and advantages of the invention are apparent from the detailed specification and thus, it is intended by the appended claims to cover all such features and advantages of the system which fall within the true spirit and scope of the invention. Further, since numerous modifications and changes may readily occur to those skilled in the art, it is not desired to limit the invention to the exact construction and operation shown and described, and accordingly, all suitable modifications and equivalents may be resorted to, falling within the scope of the invention.

What is claimed is:

1. An insulated-gate field-effect transistor formed on a semiconductor layer which is on an insulating substrate, said semiconductor layer having a first conductivity type and having a channel region therein, said insulated-gate field-effect transistor comprising:

a drain region in said semiconductor layer and doped with a first impurity having a second conductivity type opposite the first conductivity type;

a gate insulation layer formed over the channel region which is formed in said semiconductor layer, the channel region being adjacent to said drain region;

a gate electrode formed over said gate insulation layer; and a source region in said semiconductor layer and doped with said first impurity, said source region being adjacent to the channel region, so that the channel region is between said source region and said drain region, a first pn-junction being formed between said source region and said semiconductor layer and a second pn-junction being formed between said drain region and said semiconductor layer, said first pn-junction having a carrier generation center formed of a metal impurity doped more than its solid solubility in said source region so as to provide a first leakage current across said first pn-junction, an electrical resistance across said first pn-junction caused by said first leakage current being less than an electrical resistance caused by a second leakage current across said second pn-junction, and is adequately low to suppress a kink phenomenon in drain voltage-current characteristics of said insulated-gate field-effect transistor.

2. An insulated-gate field-effect transistor as recited in claim 1, wherein said metal impurity is an ion implanted impurity which is implanted into said first pn-junction.

3. An insulated-gate field-effect transistor as recited in claim 1, further comprising a metal layer deposited over said source region, wherein said metal impurity is a diffused metal impurity which is diffused from said metal layer deposited over said source region through said source region to said first pn-junction by a heat process.

4. An insulated-gate field-effect transistor as recited in claim 1, wherein said metal impurity is precipitated across a portion of said first pn-junction facing said channel region.

5. An insulated-gate field-effect transistor as recited in claim 1, wherein said source region comprises at least one additional kind of metal impurity than said drain region.

6. An insulated-gate field-effect transistor as recited in claim 1, wherein said metal impurity is chosen from the group consisting of aluminum, molybdenum, platinum, tin, titanium, and tungsten.

7. An insulated-gate field-effect transistor as recited in claim 1, wherein said source region is essentially formed of an amorphous semiconductor material.

8. An insulated-gate field-effect transistor as recited in claim 1, wherein said insulating substrate essentially comprises a silicon body and a silicon dioxide layer formed thereon.

9. An insulated-gate field-effect transistor as recited in claim 1, wherein said semiconductor layer comprises a silicon material.

10. An insulated-gate field-effect transistor as recited in claim 1, wherein said carrier generation center extends to the insulating substrate.

11. An insulated-gate field-effect transistor formed on a semiconductor layer which is on an insulating substrate, said semiconductor layer having a first conductivity type and having a channel region therein, said insulated-gate field-effect transistor comprising:

a drain region in said semiconductor layer and doped with a first impurity having a second conductivity type opposite the first conductivity type;

a gate insulation layer formed over the channel region which is formed in said semiconductor layer, the channel region being adjacent to said drain region;

a gate electrode formed over said gate insulation layer; and a source region in said semiconductor layer and doped with said first impurity, said source region being adjacent to the channel region, so that the channel region is between said source region and said drain region, said source region having a thermal stress therein which is higher than a thermal stress in said drain region so as to produce a piezo-resistive effect, said piezo-resistive effect producing a first leakage current across a first pn-junction formed between said source region and said semiconductor layer, a second pn-junction being formed between said drain region and said semiconductor layer, an electrical resistance across said first pn-junction caused by said first leakage current being less than an electrical resistance across said second pn-junction caused by a second leakage current, and being adequately low to suppress a kink phenomenon in drain voltage-current characteristics of said insulated-gate field-effect transistor.

12. An insulated-gate field-effect transistor as recited in claim 11, further comprising:

a layer formed on said source region without being formed on said drain region, said layer having a thermal expansion coefficient different from a thermal expansion coefficient of said source region.

13. An insulated-gate field-effect transistor as recited in claim 11, wherein said insulating substrate essentially comprises a silicon body and a silicon dioxide layer formed thereon.

14. An insulated-gate field-effect transistor as recited in claim 11, wherein said semiconductor layer comprises a silicon material.

15. An insulated-gate field-effect transistor comprising:

an insulating substrate;

a semiconductor layer on said insulating substrate, said semiconductor layer having first and second doped regions and having a channel region between said first and second doped regions, a first pn-junction being formed between said first doped region and said semiconductor layer, and a second pn-junction being formed between said second doped region and said semiconductor layer, said first doped region further including means for increasing a first leakage current across the first pn-junction so that it is more than a second leakage current across the second pn-junction, said means including a carrier generation center at the first pn-junction for providing a current path across the first pn-junction, said first leakage current being adequate to suppress a kink phenomenon in drain voltage-current characteristics of said insulated-gate field-effect transistor, said carrier generation center being formed of a metal impurity doped in said first doped region more than its solid solubility;

an insulation layer on said channel region; and a gate electrode on said insulation layer.

16. An insulated-gate field-effect transistor as recited in claim 15, further comprising a metal layer, having said metal impurity, on said first doped region, wherein said metal impurity is diffused through said first doped region to the first pn-junction.

17. An insulated-gate field-effect transistor as recited in claim 15, wherein said first doped region is formed of an amorphous semiconductor material.

* * * * *